(12) United States Patent
Jang et al.

(10) Patent No.: US 10,403,520 B2
(45) Date of Patent: Sep. 3, 2019

(54) MULTI-BLADE AND PROCESSING METHOD OF WORKPIECE

(71) Applicant: DISCO CORPORATION, Tokyo (JP)

(72) Inventors: Byeongdeck Jang, Tokyo (JP); Youngsuk Kim, Tokyo (JP); Takahiro Ishii, Tokyo (JP); Maki Sakai, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 16/113,496

(22) Filed: Aug. 27, 2018

(65) Prior Publication Data

US 2019/0067050 A1 Feb. 28, 2019

(30) Foreign Application Priority Data

Aug. 30, 2017 (JP) ................ 2017-165963

(51) Int. Cl.
| | |
|---|---|
| *B24D 5/12* | (2006.01) |
| *H01L 21/48* | (2006.01) |
| *H01L 21/56* | (2006.01) |
| *H01L 21/67* | (2006.01) |
| *H01L 21/78* | (2006.01) |
| *H01L 23/00* | (2006.01) |
| *H01L 23/31* | (2006.01) |
| *H01L 23/498* | (2006.01) |
| *H01L 23/552* | (2006.01) |

(52) U.S. Cl.
CPC ........ *H01L 21/67092* (2013.01); *B24D 5/123* (2013.01); *H01L 21/4853* (2013.01); *H01L 21/561* (2013.01); *H01L 21/78* (2013.01); *H01L 23/3114* (2013.01); *H01L 23/49811* (2013.01); *H01L 23/49838* (2013.01); *H01L 23/552* (2013.01); *H01L 24/48* (2013.01); *H01L 2224/48227* (2013.01); *H01L 2924/181* (2013.01); *H01L 2924/3025* (2013.01)

(58) Field of Classification Search
None
See application file for complete search history.

(56) References Cited

U.S. PATENT DOCUMENTS 6,517,427 B1 * 2/2003 Yoshikawa ............. B24D 5/12
 451/544
6,659,098 B1 * 12/2003 Sekiya ................. B23D 59/002
 125/13.01

(Continued)

FOREIGN PATENT DOCUMENTS

JP 2015018965 A 1/2015

*Primary Examiner* — Thien F Tran
(74) *Attorney, Agent, or Firm* — Greer Burns & Crain, Ltd.

(57) ABSTRACT

A multi blade that processes semiconductor packages into a desired shape while dividing a package substrate includes plural cutting blades that divide the package substrate into the individual semiconductor packages and a spacer provided between two cutting blades adjacent to each other, and is configured in such a manner that the cutting blades and the spacer have the same rotation axis center. The outer surface of the spacer is formed into a transfer shape of the semiconductor package and is covered by an abrasive grain layer, and the upper surface of the package substrate is ground by the outer surface of the spacer simultaneously with cutting of the package substrate by the plural cutting blades.

3 Claims, 9 Drawing Sheets

(56) References Cited

U.S. PATENT DOCUMENTS

2005/0229914 A1\* 10/2005 Umahashi ............ B25B 11/005
　　　　　　　　　　　　　　　　　　　　　　　125/13.01
2011/0290078 A1\* 12/2011 Cady .................... B24D 5/123
　　　　　　　　　　　　　　　　　　　　　　　76/107.1

\* cited by examiner

MULTI-BLADE AND PROCESSING METHOD OF WORKPIECE

BACKGROUND OF THE INVENTION

Field of the Invention

The present invention relates to a multi-blade and a processing method of a workpiece.

Description of the Related Art

In a device manufacturing step, individual device chips are formed by cutting various kinds of substrates such as a wafer and a semiconductor package substrate by a cutting blade along streets. As such a processing method, a step cut is known by which the cutting depth is increased in a stepwise manner with respect to a substrate by using two kinds of blades. In the step cut, a shallow groove of a first step is formed along a street of a substrate by a large-width straight blade or V-blade. Then, the bottom surface of the shallow groove is deeply cut by a small-width straight blade and the substrate is fully cut (for example, refer to Japanese Patent Laid-open No. 2015-018965).

SUMMARY OF THE INVENTION

Incidentally, depending on the kind of substrate, there is a demand for giving various shapes such as inclinations and steps to chips after dividing. Various shapes can be given to the chips by employing the step cut described in Japanese Patent Laid-open No. 2015-018965. However, the substrate needs to be cut in a stepwise manner by using two kinds of blades and there is a problem that the work man-hours increase and the work time becomes longer.

Thus, an object of the present invention is to provide a multi-blade that can give inclinations or steps to chip side surfaces simultaneously with dividing into individual chips and a processing method of a workpiece using the multi-blade.

In accordance with an aspect of the present invention, there is provided a multi-blade that processes a workpiece into a desired shape while dividing the workpiece. The multi-blade includes a shaft that is rotationally driven, a plurality of cutting blades that are mounted to the shaft and divide the workpiece into individual chips, and a spacer that is mounted to the shaft between two adjacent cutting blades. An outer surface of the spacer exposed from between the cutting blades is formed into a transfer shape that forms the desired shape in the outer circumference of the chip and is covered by an abrasive grain layer.

According to this configuration, because the plural cutting blades are provided in the multi-blade, the workpiece is simultaneously cut by the plural cutting blades along the plural planned dividing lines and is diced. Furthermore, because the outer surface of the spacer between the two cutting blades is covered by the abrasive grain layer, the workpiece is ground by the outer surface of the spacer and the outer surface shape of the spacer is transferred to the outer surface of the chip. As above, the workpiece is divided along the planned dividing lines and various shapes can be given to the outer surfaces of the chips simultaneously with the dividing. Thus, the work man-hours can be reduced and the work time can be greatly shortened.

In accordance with another aspect of the present invention, there is provided a processing method in which chips after dividing are processed into a desired shape while a workpiece having a front surface in which a plurality of planned dividing lines that intersect are formed is divided along the planned dividing lines by using the multi-blade described above. The processing method includes a holding step of holding a back surface of the workpiece by a holding jig or a holding tape and a dividing step of carrying out cutting to middle of the holding tape or into the holding jig by the cutting blades of the multi-blade along the planned dividing lines to divide the workpiece into the individual chips after carrying out the holding step. The desired shape is formed in an upper surface and/or a side surface of each chip by the abrasive grain layer of the outer surface of the spacer when dividing the workpiece into the individual chips in the dividing step.

Preferably, the workpiece is a package substrate in which semiconductor components on a wiring board are sealed by a resin layer. The chip is a semiconductor package obtained by dividing a package substrate. An inclined surface or a step part is formed in an end part which is to be in contact with the cutting blade of the spacer of the multi-blade. Inclinations or steps are formed in package side surfaces by the inclined surface or the step part of the outer surface of the spacer in such a manner that the lower surface side of each semiconductor package becomes larger than the upper surface side of the semiconductor package in the dividing step. Preferably, the processing method further includes a shield layer forming step of forming a shield layer on the upper surfaces and inclined surfaces of a plurality of the semiconductor packages.

According to the present invention, by covering the outer surface of the spacer between the plural cutting blades by the abrasive grain layer, various shapes can be given to the outer surfaces of the chips simultaneously with the dividing into the individual chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE
PREFERRED EMBODIMENT

Figure 1:
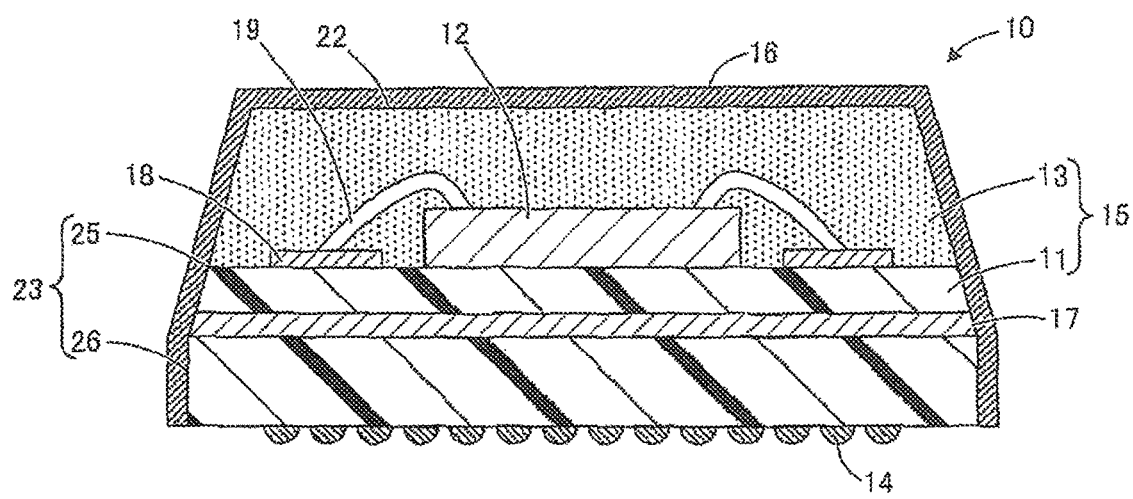
FIG. 1 is a sectional schematic diagram of a semiconductor package of the present embodiment.
Figure 2A:
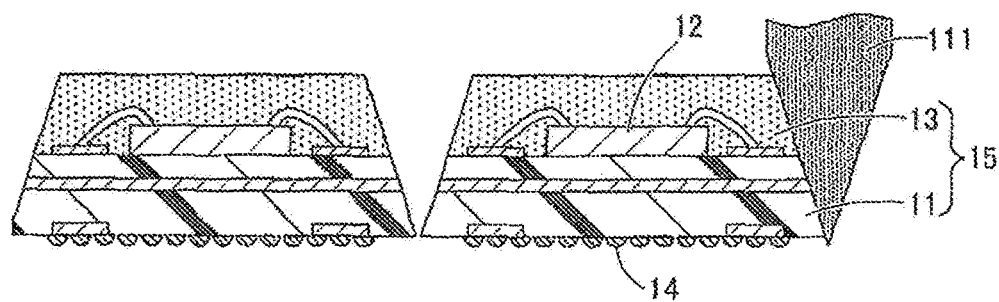
FIGS. 2A and FIG. 2B are sectional schematic diagrams depicting manufacturing methods of a semiconductor package in comparative examples.
Figure 2B:
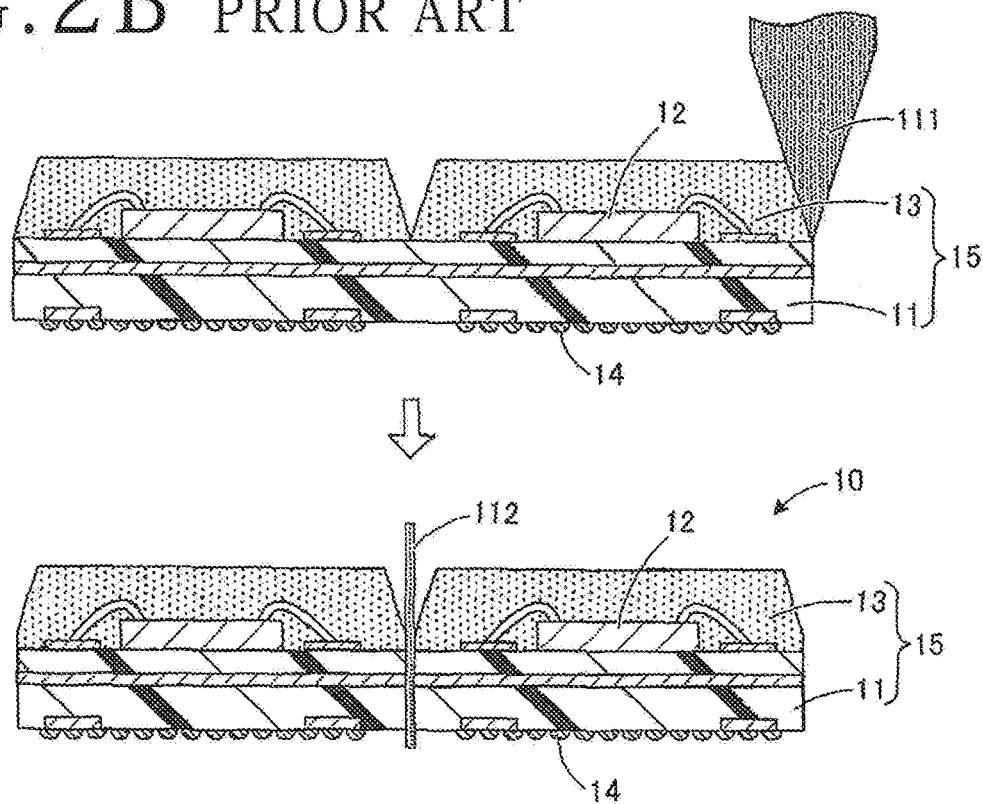

A processing method of the present embodiment will be described below with reference to the accompanying drawings. In the following description, explanation will be made with exemplification of a package substrate as a substrate. However, the kind of substrate is not limited to the package substrate. FIG. 1 is a sectional schematic diagram of a semiconductor package of the present embodiment. FIG. 2A and FIG. 2B are sectional schematic diagrams depicting manufacturing methods of a semiconductor package in comparative examples. The following embodiment merely depicts one example and another step may be included between the respective steps and the order of steps may be changed as appropriate.

As depicted in FIG. 1, a semiconductor package 10 is semiconductor apparatus of all packages that need blocking due to so-called electro-magnetic interference (EMI) and is configured to suppress leakage of electromagnetic noise to the surroundings by a shield layer 16 of the outer surface. Inside the shield layer 16, a semiconductor chip (semiconductor component) 12 mounted on the upper surface of a wiring board (interposer board) 11 is sealed by a resin layer (sealant) 13 and bumps 14 are disposed on the lower surface of the wiring board 11. In the wiring board 11, various kinds of wiring lines including electrodes connected to the semiconductor chip 12 and a ground line 17 are formed.

The semiconductor chip 12 is formed by dicing a semiconductor wafer for each device on a semiconductor substrate and is mounted at a predetermined position on the wiring board 11. Furthermore, an inclined surface 25 that extends outward from a package upper surface (chip upper surface) 22 toward the lower side is formed in a package side surface (chip side surface) 23 and the shield layer 16 is formed onto this inclined surface 25 from the upper side by a sputtering method or the like. Because the inclined surface 25 of the package side surface 23 obliquely intersects the formation direction of the shield layer 16 differently from the vertical package side surface of a general semiconductor package, the shield layer 16 is easily formed on the inclined surface 25.

Incidentally, normally, as depicted in the comparative example of FIG. 2A, the package side surface of the semiconductor package is inclined by fully cutting a package substrate 15 in which the semiconductor chip 12 on the wiring board 11 is sealed by the resin layer 13 by using a cutting blade 111 whose tip has a V-shape (hereinafter, referred to as V-blade). However, because various wiring lines (metals) are included in the wiring board 11, waste of the V-blade 111 is intense at the time of cutting of the wiring board 11 and the V-shape of the tip of the V-blade 111 readily collapses. Thus, variation is caused in the depth of cutting into the package substrate 15 and the lifetime of the V-blade 111 is shortened.

Furthermore, as depicted in the comparative example of FIG. 2B, a configuration is conceivable in which the package substrate 15 is divided by a step cut by use of the V-blade 111 and a normal cutting blade (hereinafter, referred to as straight blade) 112. Specifically, the resin layer 13 is half cut by the V-blade 111 to give an inclination and subsequently the wiring board 11 is fully cut by the straight blade 112 to divide the package substrate 15 into the individual semiconductor packages 10. This can suppress the cutting into the wiring board 11 by the V-blade 111 and reduce the waste of the V-shape of the tip of the V-blade 111. However, the cutting needs to be carried out in two stages, which increases the work man-hours and the work time and deteriorates the productivity.

Therefore, in the present embodiment, the package substrate 15 (see FIG. 6A) is processed by using a multi-blade 40 (see FIG. 3) composed of plural cutting blades 44 and spacers 43 with abrasive grains. The package substrate 15 is cut by inclined surfaces 46 of the outer surfaces of the spacers 43 and thereby inclinations are given. The package substrate 15 is cut along planned dividing lines by the plural cutting blades 44 and thereby the package substrate 15 is divided into the individual semiconductor packages 10. Thus, the package substrate 15 can be divided while inclinations are given to the package side surfaces 23 (see FIG. 6A), so that the work man hours and the work time are reduced and the productivity is improved.

Figure 3:
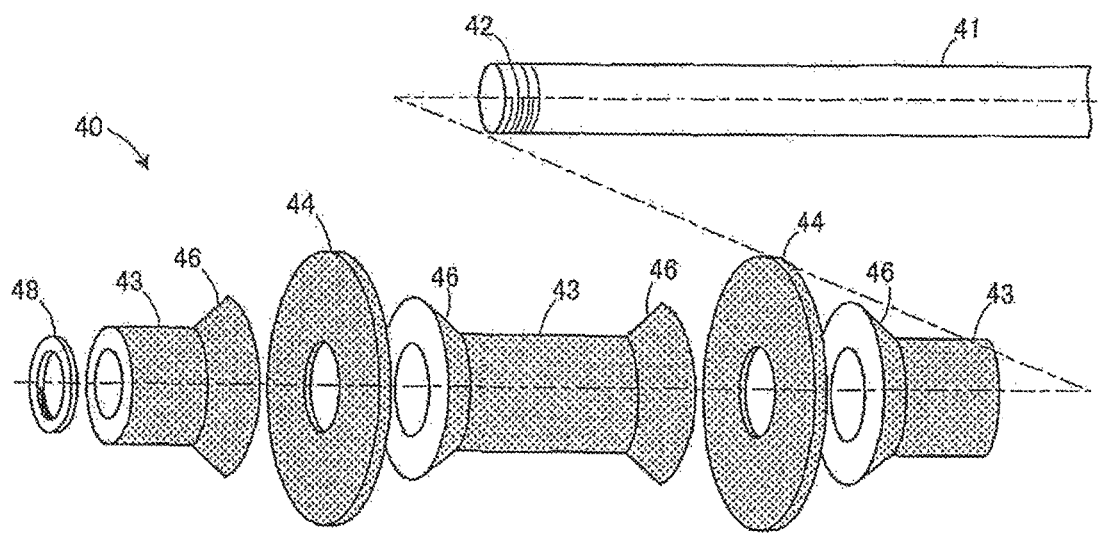
FIG. 3 is an exploded perspective view of a multi-blade of the present embodiment.
Figure 4:
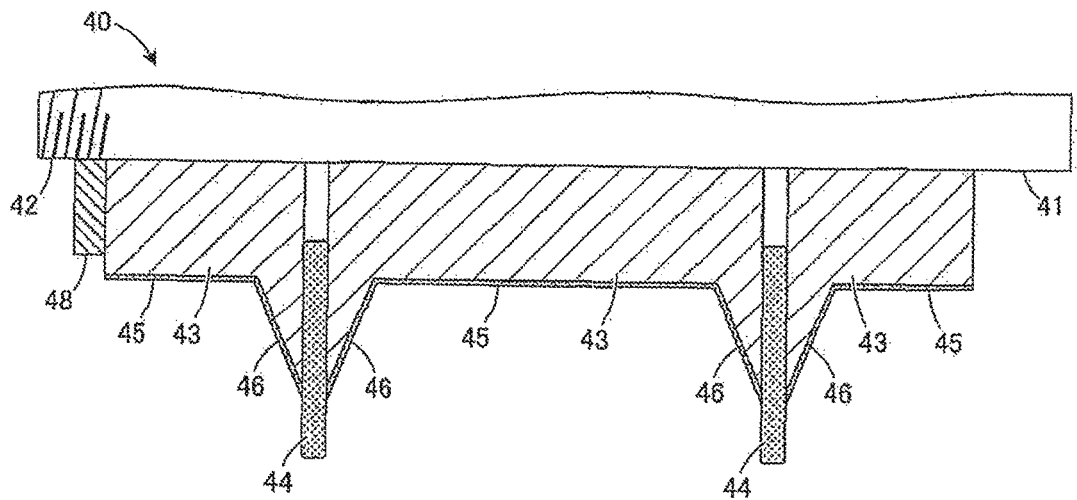
FIG. 4 is a sectional schematic diagram of the multi-blade of the present embodiment.

The multi-blade of the present embodiment will be described with reference to FIG. 3 and FIG. 4. FIG. 3 is an exploded perspective view of the multi-blade of present embodiment. FIG. 4 is a sectional schematic diagram of the multi-blade of the present embodiment.

As depicted in FIG. 3 and FIG. 4, a the multi-blade 40 is assembled by alternately fitting the plural (in the present embodiment, three) spacers 43 and a pair of cutting blades 44 to a shaft 41 connected to a spindle (not depicted) and fixing each of the spacers 43 and the cutting blades 44 to the shaft 41. The plural spacers 43 are formed into a tubular shape and the outer surface of each spacer 43 is covered by an abrasive grain layer 45.

Furthermore, the outer surface of each spacer 43 is formed with a transfer shape that forms a desired shape in the outer circumference of the semiconductor package 10. In the present embodiment, the inclined surface 46 is formed at the end part in contact with the cutting blade 44 in each spacer 43 as the transfer shape and the spacer diameter becomes larger as the position gets closer to the cutting blade 44.

In the spacers 43 at both ends, the inclined surface 46 is formed at the end part on the single side in contact with the cutting blade 44, in the spacer 43 at the center, the inclined surfaces 46 are formed at the end parts on both sides in contact with the cutting blade 44. The spacer 43 at the center separates the pair of cutting blades 44 in such a manner as to position each of the pair of cutting blades 44 to the planned dividing line. The pair of cutting blades 44 are molded, into a thin circular ring shape obtained by binding diamond abrasive grains or the like by a bond agent. The kind of cutting blade 44 is not particularly limited. However, it is preferable that a straight blade for metal cut, such as a resin blade, metal blade, or electroformed blade, be used.

A male screw 42 is formed at the tip part of the shaft 41 protruding from the spacer 43. By fastening a fixing nut 48 to this male screw 42, the plural spacers 43 and the pair of cutting blades 44 are fixed to the shaft 41. At this time, the inclined end parts of the spacers 43 function as flanges for mounting and the cutting blade 44 is fixed by being clamped from both sides by the end parts of the spacers 43. In this manner, the plural spacers 43 and the pair of cutting blades 44 are configured to have the same rotation axis center. Furthermore, the multi-blade 40 can be disassembled and thus it is possible to replace part of the spacers 43 and the cutting blades 44.

Figure 5A:
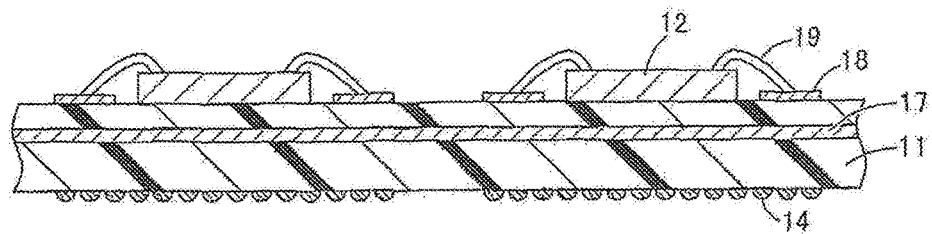
FIG. 5A to FIG. 5C are sectional schematic diagrams depicting a manufacturing method of the semiconductor package of the present embodiment.
Figure 5B:
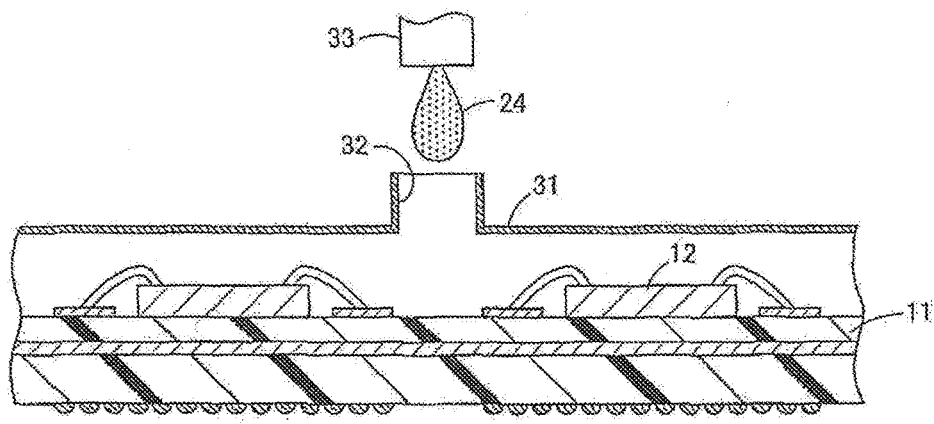
Figure 5C:
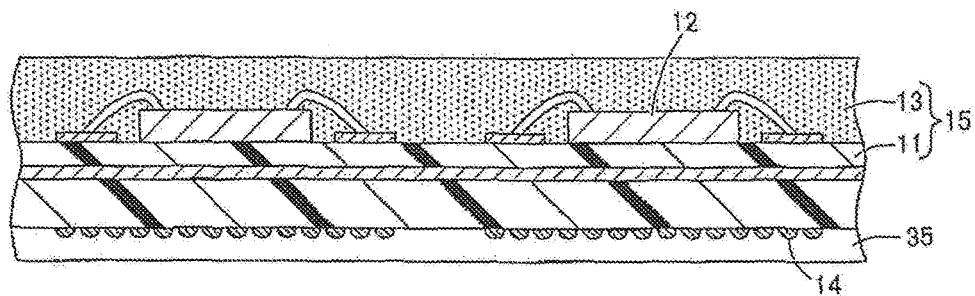
Figure 6A:
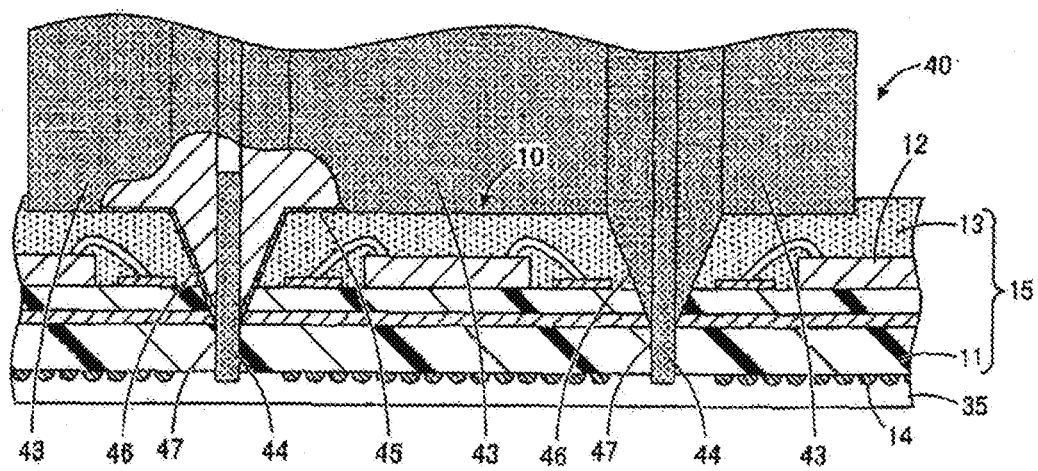
FIG. 6A to FIG. 6C are sectional schematic diagrams depicting the manufacturing method of the semiconductor package of the present embodiment.
Figure 6B:
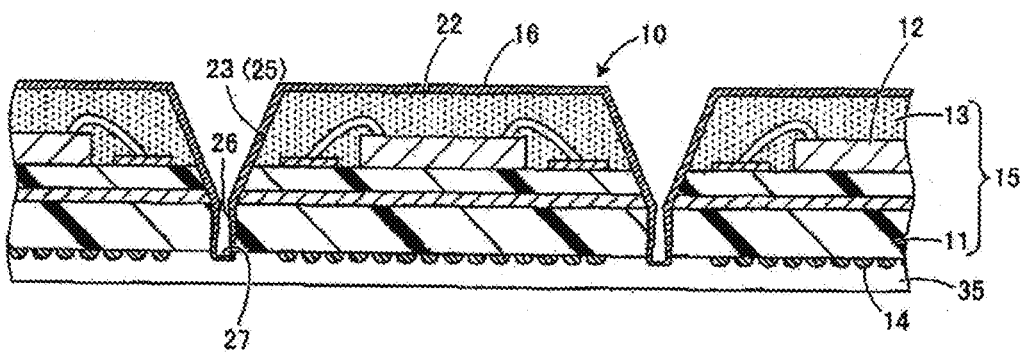
Figure 6C:
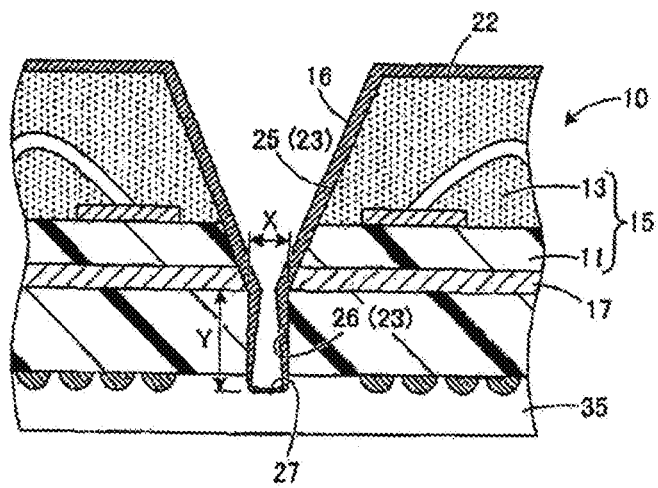

Next, a manufacturing method of the semiconductor package with use of the multi-blade will be described with reference to FIG. 5A to FIG. 5C and FIG. 6A to FIG. 6C. FIG. 5A, FIG. 5B, and FIG. 5C are sectional schematic diagrams depicting one example of each of a mounting step, a substrate fabrication step, and a holding step, respectively. Furthermore, FIG. 6A is a sectional schematic diagram depicting one example of a dividing step and FIG. 6B and FIG. 6C are sectional schematic diagrams depicting one example of a shield layer forming step.

As depicted in FIG. 5A, the mounting step is carried out first. In the mounting step, the front surface of the wiring board 11 is segmented in a lattice manner by planned dividing lines that intersect and plural semiconductor chips 12 are mounted on plural regions that are marked out. Wiring lines such as the ground line 17 are formed in the wiring board 11 and the bumps 14 are disposed on the lower surface of the wiring board 11. In this case, one end of a wire 19 is connected to an electrode on the upper surface of the semiconductor chip 12 and the other end of the wire 19 is connected to an electrode 18 on the front surface of the wiring board 11. The mounting method is not limited to wire bonding and flip-chip bonding in which an electrode on the lower surface of the semiconductor chip 12 is directly connected to the electrode on the front surface of the wiring board 11 may be carried out.

As depicted in FIG. 5B, the substrate fabrication step is carried out after the mounting step is carried out. In the substrate fabrication step, a sealant 24 is supplied to the front surface side of the wiring board 11 on which the plural semiconductor chips 12 have been mounted and each semiconductor chip 12 is sealed by the sealant 24, so that the package substrate 15 (see FIG. 5C) is fabricated. In this case, the lower surface of the wiring board 11 on which the semiconductor chips 12 have been mounted is held by a holding jig (not depicted) and a mold 31 is disposed to cover the upper surface of the wiring board 11. An injection port 32 is opened in the upper wall of the mold 31 and a supply nozzle 33 of the sealant 24 is positioned above the injection port 32.

Then, the sealant 24 is supplied to the upper surface of the wiring board 11 from the supply nozzle 33 through the injection port 32 and the semiconductor chips 12 are sealed. In this state, the sealant 24 is heated or dried to be cured and the package substrate 15 in which the resin layer 13 (see FIG. 5C) has been formed on the upper surface of the wiring board 11 is fabricated. As the sealant 24, what has curability is used. For example, the material can be selected from epoxy resin, silicone resin, urethane resin, unsaturated polyester resin, acrylic urethane resin, polyimide resin, and so forth. Furthermore, the sealant 24 is not limited to a liquid form and it is also possible to use a resin in a sheet form or a powder form. In this manner, the plural semiconductor chips 12 on the wiring board 11 are collectively sealed. If the package substrate 15 is prepared in advance, the mounting step and the substrate fabrication step may be omitted.

As depicted in FIG. 5C, the holding step is carried out after the substrate fabrication step is carried out. In the holding step, a holding tape 35 is stuck to close the center of a ring frame (not depicted) and the back surface of the package substrate 15 is held by this holding tape 35. In this case, the bumps 14 of the Package substrate 15 enter an adhesive layer of the holding tape 35 and the package substrate 15 is favorably supported by the ring frame with the intermediary of the holding tape 35. In the holding step, a ring frame having a circular shape in top view may be used and a ring frame having a rectangular shape in top view may be used.

As depicted in FIG. 6A, the dividing step is carried out after the holding step is carried out. In the dividing step, the multi-blade 40 corresponding to the outer surface shape of the semiconductor package 10 is mounted to the spindle. In the multi-blade 40, the pair of cutting blades 44 are provided corresponding to planned dividing lines and the base end side of the pair of cutting blades 44 is clamped by the inclined end parts of a pair of spacers 43. Abrasive grains of diamond or the like are electrodeposited on the outer surfaces of the spacers 43 and the abrasive grain layers 45 are formed to cover the outer surfaces of the spacers 43. By these outer surfaces of the spacers 43, grinding surfaces that grind the resin layer 13 of the package substrate 15 are formed.

As above, the blade part of the multi-blade 40 is composed of the cutting blade 44 and the inclined end parts of the spacers 43. The blade part is inclined in such a manner that the width becomes smaller in the protrusion direction from the base end, and is formed with a constant width from the midpoint in the protrusion direction to the tip. That is, the base end side of the side surfaces of the blade part serves as the inclined surfaces 46 and the tip side of the side surfaces of the blade part serves as vertical surfaces 47. Furthermore, the amount of protrusion of the cutting blades 44 from the outer surface of the spacer 43 is set to magnitude with which the semiconductor package 10 diced by the cutting blades 44 is thinned to a predetermined thickness by the outer surface of the spacer 43 when cutting to the middle of the holding tape 35 is carried out by the cutting blades 44.

When the side of the wiring board 11 of the package substrate 15 is held by a chuck table (not depicted) with the intermediary of the holding tape 35, the positions of the cutting blades 44 of the multi-blade 40 are adjusted to planned dividing lines of the package substrate 15 and the multi-blade 40 is lowered to a depth at the middle in the thickness direction of the holding tape 35 outside the package substrate 15. Then, processing feed of the package substrate 15 is carried out relative to the multi-blade 40 in the horizontal direction. Thereby, cutting to the middle of the holding tape 35 is carried out along the planned dividing lines by the cutting blades 44 of the multi-blade 40 and the package substrate 15 is divided into the individual semiconductor packages 10.

At this time, the package substrate 15 is divided by the cutting blades 44 and the resin layer 13 of the package substrate 15 is ground by the abrasive grain layers 45 of the spacers 43. Thus, the package substrate 15 is diced into the individual semiconductor packages 10 and each semiconductor package 10 is thinned to the predetermined thickness. Furthermore, because the end parts of the spacers 43 serve as the inclined surfaces 46, inclinations are given to the package side surfaces 23 in such a manner that the lower surface side of the semiconductor packages 10 becomes larger than the upper surface side. In this manner, without carrying out a step cut, the package substrate 15 is divided while inclinations are given to the package side surfaces 23.

As depicted in FIG. 6B, the shield layer forming step is carried out after the dividing step is carried out. In the shield layer forming step, the shield layer 16 is formed on the package upper surfaces (resin layer upper surfaces) 22 and the package side surfaces 23 by an electrically-conductive material from the upper side of the resin layer 13. In this case, each semiconductor package 19 is held by a holding jig (not depicted) with the intermediary of the holding tape 35.

Then, the electrically-conductive material is deposited for the semiconductor packages 10 from the upper side by sputtering or the like under a predetermined formation condition and the shield layer 16 is formed with a desired thickness on the package upper surfaces 22 and the package side surfaces 23.

At this time, the inclined surfaces 25 of the package side surfaces 23 extend outward from the package upper surface 22 toward the lower side and the inclined surfaces 25 obliquely intersect the formation direction of the shield layer 16 (vertical direction). Thus, when the shield layer 16 is formed on the semiconductor packages 10, the shield layer 16 is formed with a thickness with which a sufficient shield effect can be exerted on not only the package upper surfaces 22 but also the inclined surfaces 25 of the package side surfaces 23. The shield layer 16 is formed also on vertical surfaces 26 of the package side surfaces 23 and groove bottoms 27 between the packages. Thus, a burr is generated at the lower part of the semiconductor package 10 due to the shield layer 16 at the time of picking up of the semiconductor package 10 in some cases.

In this case, the generation of the burr on the semiconductor package 10 can be suppressed by adjusting the aspect ratio between the packages. As depicted in FIG. 6D, the aspect ratio between the packages is represented as Y/X, when the depth from the lower end of the inclined surface 25 of the package side surface 23 to the groove bottom 27 arising from cutting into the holding tape 35 is defined as Y mm and the opposing interval of the vertical surfaces 26 of the package side surfaces 23 is defined as X mm. The lower side of the vertical surface 26 of the package side surface 23 and the groove bottom 27 between the packages are susceptible to the influence of the aspect ratio and the shield layer 16 is formed with a smaller thickness as the aspect ratio between the packages becomes higher.

Therefore, the thickness of the shield layer 16 on the groove bottom 27 between the packages is reduced by setting the width dimensions and the amount of protrusion of the cutting blades 44 (see FIG. 6A) of the multi-blade 40 in addition to the film deposition condition of the shield layer 16 in such a manner that the desired aspect ratio is obtained. Due to this, the shield layer 16 is formed with a moderate thickness on the inclined surfaces 25 of the package side surfaces 23, which are less susceptible to the influence of the aspect ratio, and the shield layer 16 is formed with a small thickness on the lower side of the vertical surfaces 26 and the groove bottoms 27, which are more susceptible to the influence of the aspect ratio. Thus, leakage of electromagnetic noise is suppressed by the shield layer 16 on the upper side of the semiconductor packages 10, and the shield layer 16 is set thinner and generation of a burr is suppressed on the lower side of the semiconductor packages 10.

Furthermore, the ground line 17 of the wiring board 11 is exposed to the outside on the lower side of the inclined surfaces 25 of the package side surfaces 23. The shield layer 16 is formed with a moderate thickness on the lower side of the inclined surfaces 25 and the shield layer 16 is connected to the ground line 17. Thus, electromagnetic noise generated in the semiconductor package 10 is transferred to the outside of the semiconductor package 10 through the ground line 17. The shield layer 16 becomes thinner on the lower side of the vertical surfaces 26 of the package side surfaces 23. However, the electromagnetic noise is cut by a large number of wiring lines (not depicted) of the wiring board 11. Therefore, leakage of the electromagnetic noise to electronic components around the semiconductor package 10 is totally prevented. Moreover, it suffices for the ground line 17 of the wiring board 11 to be connected to the shield layer 16, and the ground line 17 may be connected to the shield layer 16 at the vertical surface 26 of the package side surface 23.

The shield layer 16 is a multilayer film that is deposited by one or more metals among copper, titanium, nickel, gold, and so forth and has a thickness of several micrometers or larger. For example, the shield layer 16 is formed by a sputtering method, ion plating method, spray coating method, chemical vapor deposition (CVD) method, ink-jet method, or screen printing method. The shield layer 16 may be formed by vacuum lamination in which a metal film having the above-described multilayer film is bonded to the package upper surfaces 22 and the package side surfaces 23 under a vacuum atmosphere. In this manner, the semiconductor packages 10 in which the package upper surfaces 22 and the package side surfaces 23 are covered by the shield layer 16 is manufactured.

Figure 7:
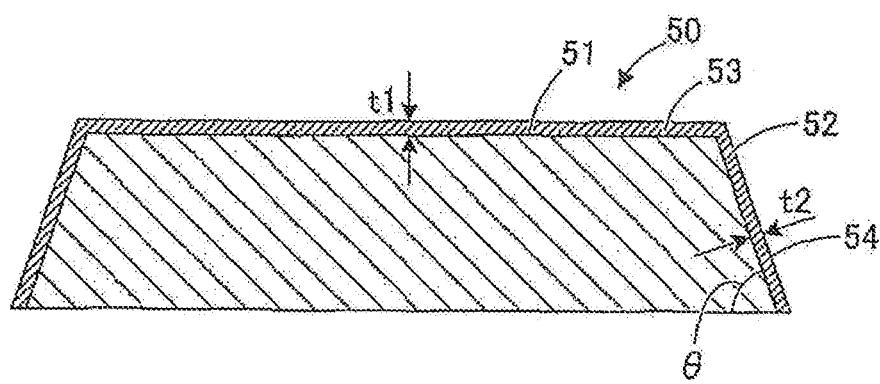
FIG. 7 is a sectional view depicting the thickness of a shield layer provided on a test body.
Figure 8:
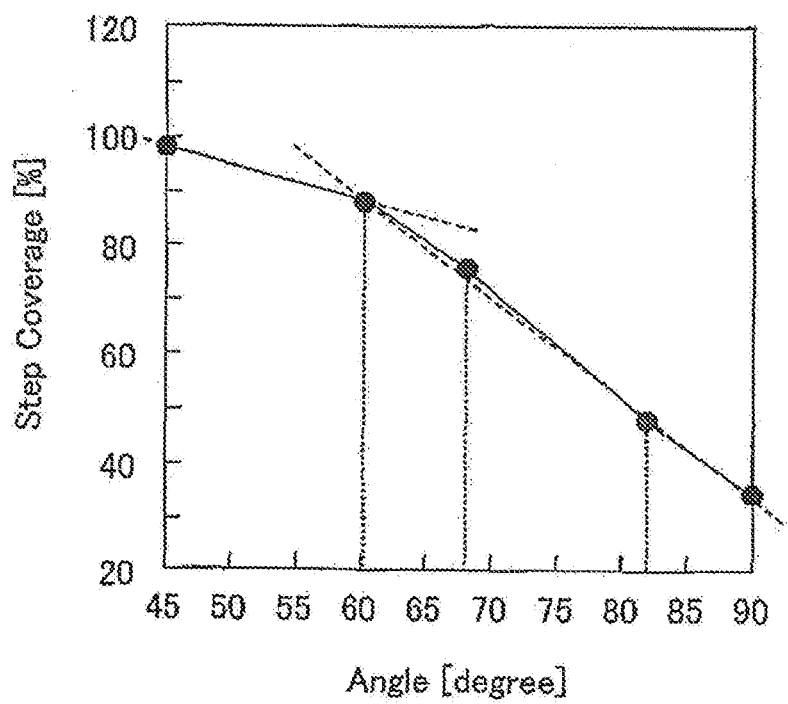
FIG. 8 is a diagram depicting the relationship between the inclination angle of a side surface of the test body and the thickness of the shield layer.

Subsequently, the relationship between the inclination angle of the side surface of the semiconductor package and the shield layer will be described. FIG. 7 is a diagram depicting the thickness of the shield layer provided in a test body. FIG. 8 is a diagram depicting the relationship between the inclination angle of a side surface of the test body and the thickness of the shield layer.

As depicted in FIG. 7, plural test bodies 50 in which an inclination angle θ of a side surface 52 was changed were prepared and the shield layer was formed by an ion plating method under a condition of 180° C. and 8×10⁻⁴ Pa. The inclination angle θ of the side surface 52 was set to 90°, 82°, 68°, 60°, and 45°. Furthermore, the shield layer was divided into an upper shield layer 53 formed on an upper surface 51 and a side shield layer 54 formed on the side surface 52 and thicknesses t1 and t2 of the upper shield layer 53 and the side shield layer 54 were measured based on observation images of a scanning electron microscope. The thicknesses t1 and t2 of the upper shield layer 53 and the side shield layer 54 were calculated as the value of step coverage depicted in the following expression (1) and the relationship between this value and the inclination angle θ was marshaled in FIG. 8.

$$\text{step coverage} = (t2/t1) \times 100 \tag{1}$$

As a result, the value of the step coverage gradually became larger as the inclination angle θ became smaller from 90°, and the value of the step coverage became 100% when the inclination angle θ became 45°. Specifically, when the setting was made to cause the inclination angle θ to become 45°, the thickness t1 of the upper shield layer 53 corresponded with the thickness t2 of the side shield layer 54 and the shield layer with a uniform thickness was confirmed on the upper surface 51 and the side surface 52 of the test body 50. Furthermore, according to an experiment by the inventor, when the value of the step coverage falls below 50%, it takes a long time to deposit the side shield layer 54 and the process cost increases. Thus, the range in which the value of the step coverage is equal to or higher than 50% is preferable. Therefore, it is preferable that the inclination angle θ of the side surface of the semiconductor package be at least 45° and at most 82°.

As described above, according to the multi-blade 40 of the present embodiment, the plural cutting blades 44 are provided in the multi-blade 40 and thus the package substrate 15 is simultaneously cut by the plural cutting blades 44 along plural planned dividing lines and is diced. Furthermore, the outer surfaces of the plural spacers 43 are covered by the abrasive grain layers 45. Therefore, the package substrate 15 is ground by the outer surfaces of the spacers 43, so that the package substrate 15 is thinned and inclinations are given to the package side surfaces 23. As above, the package substrate 15 is divided along the planned dividing lines and inclinations are given to the package side surfaces 23 simultaneously with the dividing. Thus, the work man-hours can be reduced and the work time can be greatly shortened.

Figure 9A:
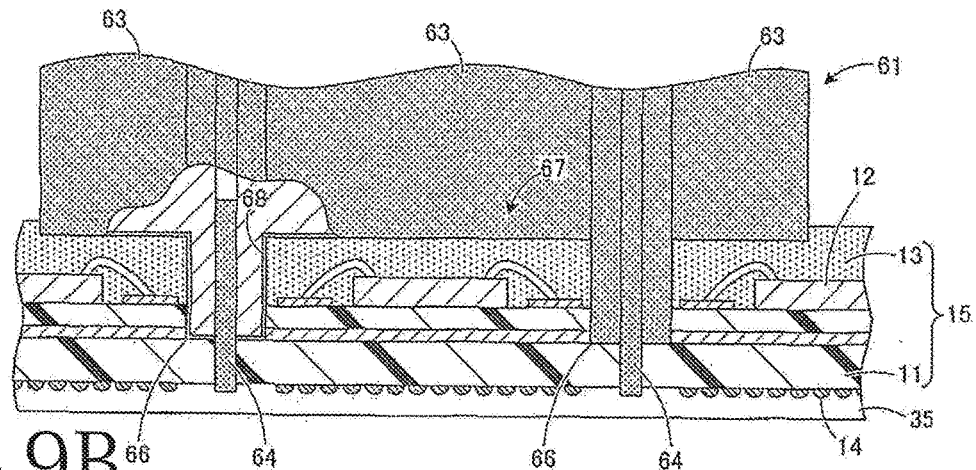
FIG. 9A to FIG. 9C are sectional schematic diagrams depicting modification examples of a dividing step.

In the present embodiment, the configuration in which inclinations are given to the package side surfaces in the dividing step is employed. However, the present invention is not limited to this configuration. For example, as depicted in a modification example of FIG. 9A, a configuration in which steps are given to package side surfaces 68 in the dividing step may be employed. In this case, as spacers 63 of a multi-blade 61, spacers in which a step part 66 is formed at the end part in contact with a cutting blade 64 is used. Due to this, the blade part of the multi-blade 61 is formed with a constant width as a larger width from the base end in the protrusion direction, and is formed with a constant width as a smaller width from the midpoint in the protrusion direction to the tip. By these step parts 66 of the outer surfaces of the spacers 63 of the multi-blade 61, steps are given to the package side surfaces 68 in such a manner that the lower surface side of semiconductor packages 67 becomes larger than the upper surface side.

Figure 9B:
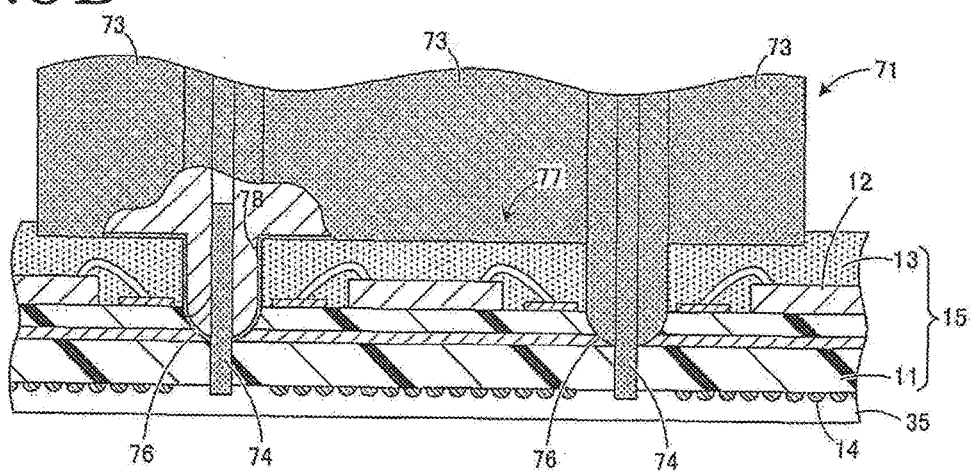

Furthermore, as depicted in a modification example of FIG. 9B, a configuration in which curved steps are given to package side surfaces 78 in the dividing step may be employed. In this case, as spacers 73 of a multi-blade 71, spacers in which a curved step part 76 is formed at the end part in contact with a cutting blade 74 is used. Due to this, the blade part of the multi-blade 71 is formed to be curved in such a manner that the width becomes smaller in the protrusion direction from the base end, and is formed with a constant width as a smaller width from the midpoint in the protrusion direction to the tip. By these step parts 76 of the outer surfaces of the spacers 73 of the multi-blade 71, steps are given to the package side surfaces 78 in such a manner that the lower surface side of semiconductor packages 77 becomes larger than the upper surface side. As above, it suffices for the step of the package side surface be a shape that generates difference in height with respect to the upper surface of the semiconductor package.

Figure 9C:
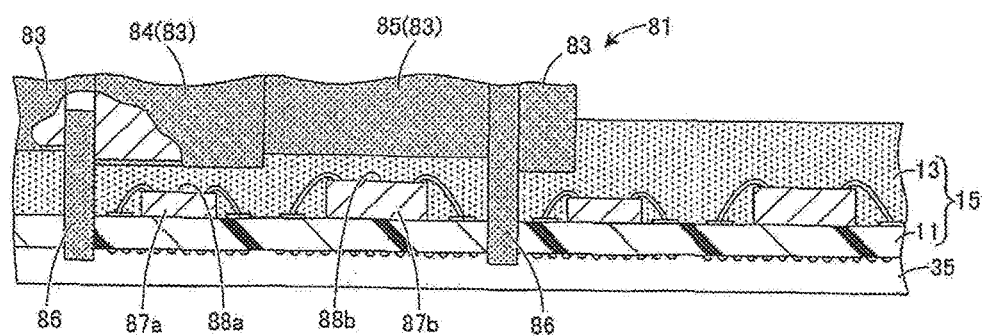

Moreover, as depicted in a modification example of FIG. 9C, a configuration may be employed in which, in the dividing step, a step is given to the package upper surface of a system in package (SIP) obtained by packaging plural semiconductor chips 87a and 87b different in the thickness. In this case, as spacers 83 of a multi-blade 81, spacers each formed into a circular cylindrical shape composed of a larger-diameter part 84 and a smaller-diameter part 85 are used. The larger-diameter part 84 protrudes relative to the smaller-diameter part 85 by the difference in the thickness between the semiconductor chips 87a and 87b. The resin layer 13 over the semiconductor chip 87a with a thinner shape is deeply ground down by the larger-diameter part 84 of this spacer 83 and the resin layer 13 over the semiconductor chip 87b with a thicker shape is shallowly ground down by the smaller-diameter part 85 of the spacer 83. Because the larger-diameter part 84 protrudes relative to the smaller-diameter part 85 by the difference in the thickness between the semiconductor chips 87a and 87b, thicknesses from chip upper surfaces 88a and 88b of the respective semiconductor chips 87a and 87b to package upper surfaces 89a and 89b are aligned. Due to this, the heat dissipation effect of the plural semiconductor chips 87a and 87b different in the thickness can be brought closer to a uniform state. As above, the present invention is not limited to the configuration in which inclinations are given to the package side surfaces in the dividing step, and it suffices to employ a configuration in which a desired shape is formed in the package upper surfaces and/or the package side surfaces when the package substrate is divided into individual semiconductor packages.

Figure 10:
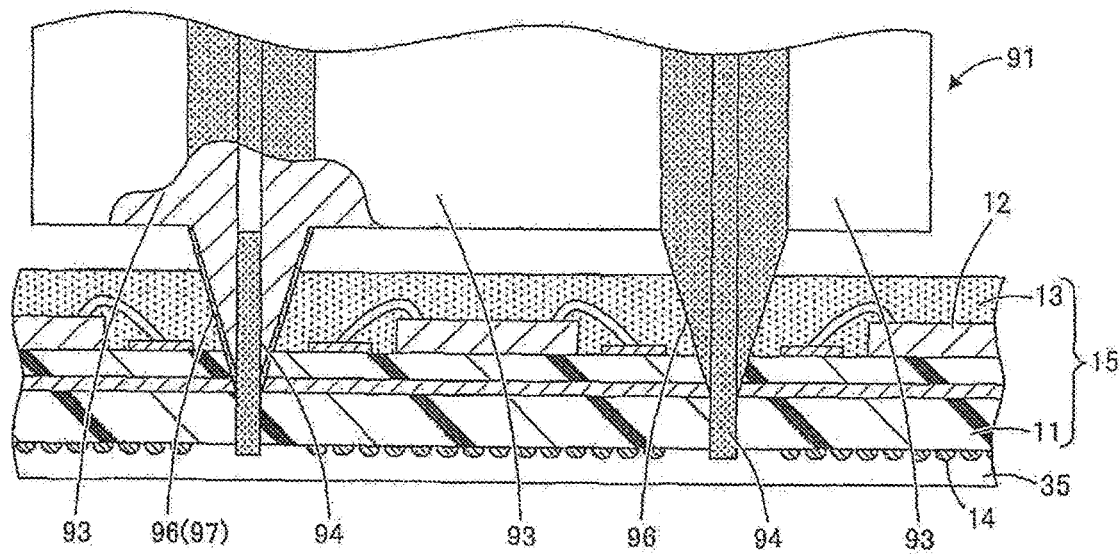
FIG. 10 is a sectional schematic diagram depicting another modification example of the dividing step.

Furthermore, in the present embodiment, the configuration in which grinding is carried out with dividing of the package substrate by a shaping abrasive is employed. However, the present invention is not limited to this configuration. As depicted in a modification example of FIG. 10, only dividing of the package substrate 15 may be carried out by cutting blades 94 and inclined surfaces 96 of spacers 93 in a multi-blade 91. In this case, abrasive grain layers 97 are formed only on the inclined surfaces 96 at the end parts of the spacers 93 and the diameter of the spacers 93 is set in such a manner that the spacers 93 excluding the end parts thereof are separate from the package substrate 15 when cutting to the middle of the holding tape 35 is carried out by the pair of cutting blades 94.

Figure 11:
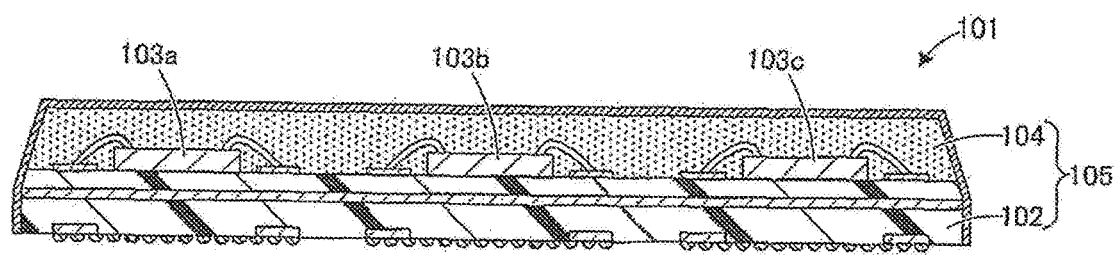
FIG. 11 is a sectional schematic diagram depicting a modification example of the semiconductor package.

Moreover, in the present embodiment, the semiconductor package in which one semiconductor chip is mounted on the wiring board is exemplified. However, the present invention is not limited to this configuration. A semiconductor package in which plural semiconductor chips are mounted on a wiring board may be manufactured. For example, as depicted in a modification example of FIG. 11, a semiconductor package 101 may be manufactured in which plural (for example, three) semiconductor chips 103a to 103c are mounted on a wiring board 102 and the semiconductor chips 103a to 103c are collectively shielded. The semiconductor chips 103a to 103c may have the same function or may have different functions.

Figure 12:
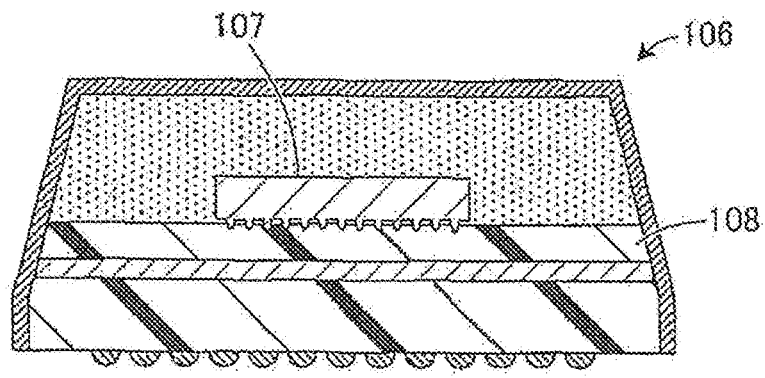
FIG. 12 is a sectional schematic diagram depicting another modification example of the semiconductor package.

In addition, in the present embodiment, the configuration is described in which the semiconductor package in which wire bonding of the semiconductor chip to electrodes on the wiring board through wires has been carried out is manufactured. However, the present invention is not limited to this configuration. As depicted in a modification example of FIG. 12, in a semiconductor package 106, a semiconductor chip 107 may be directly connected to electrodes on a wiring board 108 by flip-chip bonding.

Figure 13A:
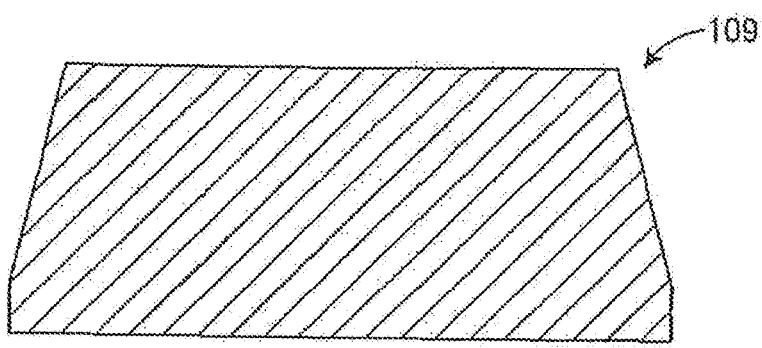
FIG. 13A and FIG. 13B are sectional views depicting modification examples of a substrate.
Figure 13B:
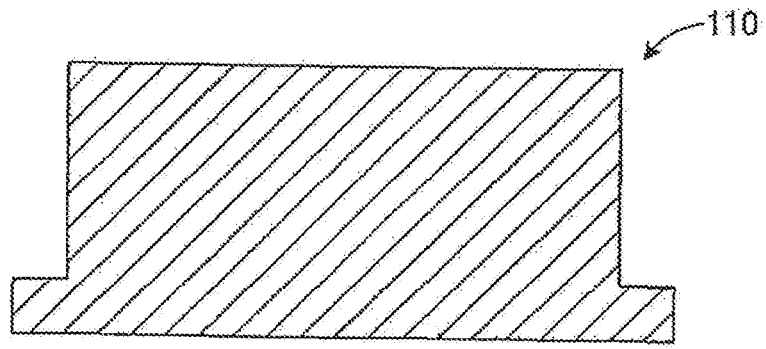

Furthermore, although the configuration in which the processing method of the present embodiment is applied to processing of a package substrate is described, the present invention is not limited to this configuration. As depicted in modification examples of FIG. 13A and FIG. 13B, the processing method of the present embodiment may be applied to processing of a wafer and inclinations or steps may be given to chip side surfaces after dividing of wafers 109 and 110. For example, when an optical device wafer is divided to manufacture light emitting diode (LED) chips, the light extraction efficiency can be improved by making inclinations or steps in the chip side surfaces.

Moreover, in the present embodiment, the multi-blade is composed of the pair of cutting blades and the three spacers. However, the present invention is not limited to this configuration. It suffices for the multi-blade to be configured in such a manner that plural cutting blades and a spacer provided between two cutting blades have the same rotation axis center. Therefore, the multi-blade may have three or more cutting blades.

In addition, in the present embodiment, the configuration in which the cutting blade is clamped by the spacers is employed. However, the present invention is not limited to this configuration. It suffices that at least the spacer be provided between the cutting blades adjacent to each other, and it suffices that the outer surface of the spacer exposed from between the cutting blades be formed with a transfer shape that forms a desired shape in the outer circumference of a chip.

Furthermore, in the present embodiment, the configuration in which each step is carried out with the back surface of the substrate held by the holding tape is employed. However, the present invention is not limited to this configuration. For example, each step may be carried out in the state in which the back surface of the substrate is held by a holding jig. Furthermore, it suffices for the holding jig to be capable of holding the substrate. For example, the holding jig may be formed of a chuck table or substrate.

Moreover, the package substrate may be a so-called fan out wafer level package (FOWLP) substrate and a configuration in which plural chips different in the thickness are mounted on a redistribution layer may be employed. Therefore, the wiring base material is not limited to the wiring board such as a printed circuit board (PCB) substrate and may be a redistribution layer of the FOWLP substrate.

In addition, as the workpiece, various kinds of works such as semiconductor device wafer, optical device wafer, package substrate, semiconductor substrate, inorganic material substrate, oxide wafer, green ceramic substrate, and piezoelectric substrate for example may be used according to the kind of processing. As the semiconductor device wafer, a silicon wafer or compound semiconductor wafer after formation of devices may be used. As the optical device wafer, a sapphire wafer or silicon carbide wafer after formation of devices may be used. Furthermore, a chip size package (CSP) substrate may be used as the package substrate. Silicon, gallium arsenide, or the like may be used as the semiconductor substrate. Sapphire, ceramics, glass, or the like may be used as the inorganic material substrate. Moreover, as the oxide wafer, lithium tantalate or lithium niobate after formation of devices or before formation of devices may be used.

Furthermore, embodiments of the present invention are not limited to the above-described embodiment and modification examples and may be variously changed, replaced, and modified without departing from the gist of technical ideas of the present invention. Moreover, if a technical idea of the present invention can be implemented in another way based on the progress of a technique or another technique that is derivative, the technical idea may be carried out by using the method. Therefore, the scope of claims covers all embodiments that can be included in the range of the technical ideas of the present invention.

Moreover, although the configuration in which the present invention is applied to a processing method of semiconductor package, wafer, and so forth is described in the present embodiment, it is also possible to apply the present invention to a processing method of another processing target, divided into individual chips.

As described above, the present invention has an effect that inclinations or steps can be given to chip side surfaces simultaneously with dividing into individual chips and is useful particularly for a multi-blade and a processing method used for portable communication equipment.

The present invention is not limited to the details of the above described preferred embodiment. The scope of the invention is defined by the appended claims and all changes and modifications as fall within the equivalence of the scope of the clams are therefore to be embraced by the invention.

What is claimed is:

1. A multi-blade that processes a workpiece into a desired shape while dividing the workpiece, the multi-blade comprising:
   a shaft that is rotationally driven;
   a plurality of cutting blades that are mounted to the shaft and divide the workpiece into individual chips; and
   a spacer that is mounted to the shaft between two adjacent cutting blades,
   wherein an outer surface of the spacer exposed from between the cutting blades is formed into a transfer shape that forms the desired shape in an outer circumference of the chip and is covered by an abrasive grain layer.

2. A processing method in which chips after dividing are processed into a desired shape while a workpiece having a front surface in which a plurality of planned dividing lines that intersect are formed is divided along the planned dividing lines by using a multi-blade including a shaft that is rotationally driven, a plurality of cutting blades that are mounted to the shaft and divide the workpiece into individual chips, and spacer that is mounted to the shaft between two adjacent cutting blades, the processing method comprising:
   a holding step of holding a back surface of the workpiece by a holding jig or a holding tape; and
   a dividing step of carrying out cutting to middle of the holding tape or into the holding jig by the cutting blades of the multi-blade along the planned dividing lines to divide the workpiece into the individual chips after carrying out the holding step,
   wherein the desired shape is formed in an upper surface and/or a side surface of each chip by an abrasive grain layer of an outer surface of the spacer when dividing the workpiece into the individual chips in the dividing step.

3. The processing method according to claim 2,
   wherein the workpiece is a package substrate in which semiconductor components on a wiring board are sealed by a resin layer,
   the chip is a semiconductor package obtained by dividing a package substrate,
   an inclined surface or a step part is formed in an end part of the spacer which is to be in contact with the cutting blade,
   inclinations or steps are formed in package side surfaces by the inclined surface or the step part of the outer surface of the spacer in such a manner that a lower surface side of each semiconductor package becomes larger than an upper surface side of the semiconductor package in the dividing step, and
   the processing method further comprises a shield layer forming step of forming a shield layer on the upper surfaces and inclined surfaces of a plurality of the semiconductor packages.

* * * * *